(12) United States Patent
Lai et al.

(10) Patent No.: US 10,318,857 B1
(45) Date of Patent: **\*Jun. 11, 2019**

(54) PRINTED RFID SENSOR TAG

(71) Applicant: BGT MATERIALS LIMITED, Manchester (GB)

(72) Inventors: Chung-Ping Lai, Hsinchu County (TW); Kuo-Hsin Chang, Chiayi (TW)

(73) Assignee: BGT Materials Limited, Manchester (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/827,751

(22) Filed: Nov. 30, 2017

(51) Int. Cl.
*G06K 19/07* (2006.01)
*H01Q 1/22* (2006.01)
*G06K 19/077* (2006.01)
*H05K 3/12* (2006.01)

(52) U.S. Cl.
CPC ..... *G06K 19/0776* (2013.01); *G06K 19/0717* (2013.01); *G06K 19/07773* (2013.01); *G06K 19/07775* (2013.01); *H01Q 1/2208* (2013.01); *H05K 3/12* (2013.01); *H04Q 2209/47* (2013.01)

(58) Field of Classification Search
CPC .......... G06K 19/07749; G06K 19/041; G06K 19/0716; G06K 19/07758; G06K 7/10356; H04Q 9/00; H01L 29/86; H01L 29/7881
See application file for complete search history.

(56) References Cited

U.S. PATENT DOCUMENTS

| | | | |
|---|---|---|---|
| 7,911,345 B2 | 3/2011 | Potyuailo et al. | |
| 7,969,307 B2 * | 6/2011 | Peeters | A61B 5/0002 340/572.1 |
| 9,594,992 B1 | 3/2017 | Lai | |
| 9,639,800 B2 * | 5/2017 | Novoselov | H04Q 9/00 |
| 9,911,017 B2 * | 3/2018 | Uhl | G06K 7/10356 |
| 2006/0109119 A1 * | 5/2006 | Burr | G06K 19/07749 340/572.1 |
| 2007/0007342 A1 * | 1/2007 | Cleeves | G06K 19/07749 235/435 |
| 2007/0128760 A1 * | 6/2007 | Subramanian | H01L 29/86 438/57 |
| 2009/0212919 A1 * | 8/2009 | Selgrath | G06K 19/041 340/10.1 |
| 2009/0273439 A1 * | 11/2009 | Selsor | G06F 21/35 340/5.61 |
| 2011/0012809 A1 * | 1/2011 | Cho | G06K 19/07749 343/904 |
| 2012/0050011 A1 * | 3/2012 | Forster | G06K 19/0716 340/10.1 |
| 2013/0328117 A1 * | 12/2013 | Hommelgaard | H01L 29/7881 257/315 |
| 2014/0095102 A1 | 4/2014 | Potyuailo et al. | |
| 2014/0367295 A1 * | 12/2014 | Murray | B65D 33/004 206/459.5 |

(Continued)

*Primary Examiner* — Hoi C Lau

(57) ABSTRACT

A printed RFID sensor tag contains: a substrate, a RFID sensor arranged on a top of the substrate, and a protective layer covering the RFID sensor. The RFID sensor includes a RFID sensing antenna and a chip adhered on the RFID sensing antenna. The RFID sensing antenna is partially or totally made of conductive sensing ink/glue printed on the top of the substrate, and the conductive sensing ink/glue consists of conductive ink/glue and multiple sensing materials.

10 Claims, 6 Drawing Sheets

(56) References Cited

U.S. PATENT DOCUMENTS

| | | | |
|---|---|---|---|
| 2015/0129283 A1* | 5/2015 | Xiao | H01Q 1/38 |
| | | | 174/250 |
| 2016/0307092 A1* | 10/2016 | Wable | G06K 19/07758 |
| 2016/0321479 A1* | 11/2016 | Uhl | G06K 7/10356 |
| 2017/0046610 A1* | 2/2017 | Novoselov | H04Q 9/00 |
| 2017/0098508 A1* | 4/2017 | Kamath | H01G 4/40 |
| 2017/0213648 A1* | 7/2017 | Joyce | H01G 4/30 |
| 2018/0015331 A1* | 1/2018 | Luciano | A63B 37/0075 |

* cited by examiner

PRINTED RFID SENSOR TAG

FIELD OF THE INVENTION

The present invention relates to a printed RFID sensor tag which contains multiple sensing materials capable of sensing multiple sensed targets of various physical or chemical properties.

BACKGROUND OF THE INVENTION

With reference to FIG. 1, low-frequency radio frequency identification (RFID) system (125-134 kHz) and a high-frequency radio frequency identification (RFID) system (13.56 MHz) transmit signals within a distance of several cm to 1 M. A transmission range of UHF radio frequency identification (RFID) system (860-960 MHz) is up to 10 M. A transmission rage of microwave frequency band RFID system (2.4 GHz) is up to 30M. Thus, the UHF radio frequency identification (RFID) system and the microwave frequency band RFID system are applied to sense sensed targets in a long distance.

Referring to FIG. 2, methods and systems for integrated interrogation of RFID sensors are disclosed in U.S. Pat. No. 8,717,146. To sense targets accurately, multiple spectrum parameters (such as frequency positions (FP) of Zre(f) and magnitude Zp(f),) resonance (F1), and anti-resonance (F2) are measured. When airs attach on a RFID sensor, dielectric constants of sensing films change so as to alter impedance parameters of RFID sensor antenna.

Methods and systems for calibration of RFID sensors are disclosed in U.S. Pat. No. 7,911,345 and contains RFID antenna made of sensing material configured to change response of impedance as airs attaches on the sensing material. A complementary sensor resistance and/or a capacitor are connected with an antenna and IC memory chip so as to calibrate impedance response of the RFID sensors.

Systems and methods for monitoring sensors are disclosed in US Publication No. 20140095102, wherein sensing material layers is coated on high frequency (HF) and ultrahigh frequency (UHF) RFID antenna, and one specific of the sensing materials is coated on one of tags, but each tag is merely configured to sense one target. A long-distance RFID sensor is configured to sense explosive, yet the high-frequency RFID sensor cannot be used to sense targets in a long distance.

Identifiable ticket and monitoring system therefor are disclosed in U.S. Pat. No. 9,594,992 B1, wherein the identifiable ticket contains a body and a radio frequency identification (RFID) tag attached on the body. The RFID tag includes a chip and an antenna, the chip stores an identified message, and the antenna is electrically connected with the chip. The body includes a ticket stub and at least one separable part removable from the ticket stub so as to tear off the antenna, hence the RFID tag responds reading operations of at least one tag reader in different frequency bands and distances after the antenna is torn off or based on a length of the antenna. A monitoring system for the identifiable ticket contains the identifiable ticket, a computer, and the at least one tag reader. The at least one tag reader is connected with the computer and reads the RFID tag so as to acquire and to send the identified message to the computer. After the body is torn off, the RFID tag responds reading operation to readers of various tags in different bands and distances. However, the RFID tag cannot senses multiple targets of various physical or chemical properties.

Printed radio frequency sensor structure and a method of preparing a RFID sensor tag is disclosed in U.S. Pat. No. 9,639,800 B2, wherein the Printed radio frequency sensor contains: a substrate, a RF antenna arranged on a top surface of the substrate, and a protection layer covering on the RF antenna arranged, wherein plural sensing materials are directly introduced into a RF antenna mixture of the RF antenna. A method of preparing a RFID sensor tag comprising steps of: A). Printing conductive sensing ink/glue on substrate; B. Drying, curing and compressing the conductive sensing ink/glue to form a conductive antenna mixture with plural sensing materials; C). Bonding a chip on a RFID sensing antenna to form a RFID sensor tag; and D). Coating a protection layer on a top of the RFID sensor tag. Here note protection coating can fully, partially or no cover the conductive sensing antenna. However, the printed radio frequency sensor structure merely responds reading operation of a sole tag reader in a single band.

The present invention has arisen to mitigate and/or obviate the afore-described disadvantages.

SUMMARY OF THE INVENTION

The primary aspect of the present invention is to provide a printed RFID sensor tag which contains multiple sensing materials capable of sensing multiple sensed targets of various physical or chemical properties.

To obtain above-mentioned aspect, a printed RFID sensor tag provided by the present invention contains: a substrate, a RFID sensor arranged on a top of the substrate, and a protective layer covering the RFID sensor.

The RFID sensor includes a RFID sensing antenna and a chip adhered on the RFID sensing antenna, wherein the RFID sensing antenna is partially or totally made of conductive sensing ink/glue printed on the top of the substrate, and the conductive sensing ink/glue consists of conductive ink/glue and multiple sensing materials.

Preferably, the multiple sensing materials are oxides-based semiconductor materials or other-based semiconductor materials.

Preferably, the multiple sensing materials are any one of chemically sensitive materials, photosensitive materials, thermal-sensitive materials, force-sensitive materials, and magnetic-sensitive materials.

Preferably, a conductor of the conductive sensing ink/glue is any one of metal, carbon, conductive polymers, and mixture of the metal, the carbon, and the conductive polymers.

Preferably, the protective layer totally, partially covers or does not cover the RFID sensing antenna.

Preferably, the RFID sensing antenna includes a main part and a frequency modulation part, the main part is electrically connected with the frequency modulation part and is made of conductive ink/glue, and the frequency modulation part is made of conductive sensing ink/glue.

Preferably, multiple sensing materials of the conductive sensing ink/glue of the frequency modulation part are any one of oxides-based semiconductor materials or other-based semiconductor materials.

Preferably, multiple sensing materials of the conductive sensing ink/glue of the frequency modulation part are any one of metal, carbon, polymer, organic modifiers, and mixture of the metal, the carbon, the polymer, and the organic modifiers.

Preferably, the RFID sensing antenna includes a first part, a second part, and a sensing part, wherein a first distal segment of the first part separates from a second distal segment of the second part so as to produce an open circuit between the first distal segment of the first part and the second distal segment of the second part, wherein a chip adheres on a connection portion of the first part and the second part, the sensing part is coupled with the first segment of the first part and the second segment of the second part; the first part and the second part are made of conductive ink/glue, and the sensing part are made of conductive sensing ink/glue, wherein the sensing part is a normal open circuit and changes to a closed circuit after being influenced by multiple sensed targets.

Preferably, multiple sensing materials of the conductive sensing ink/glue of the sensing part are oxides-based semiconductor materials or other-based semiconductor materials.

Preferably, multiple sensing materials of the conductive sensing ink/glue of the sensing part are any one of metal, carbon, polymer, organic modifiers, and mixture of the metal, the carbon, the polymer, and the organic modifiers.

DETAILED DESCRIPTION OF THE PREFERRED EMBODIMENTS

Figure 1:
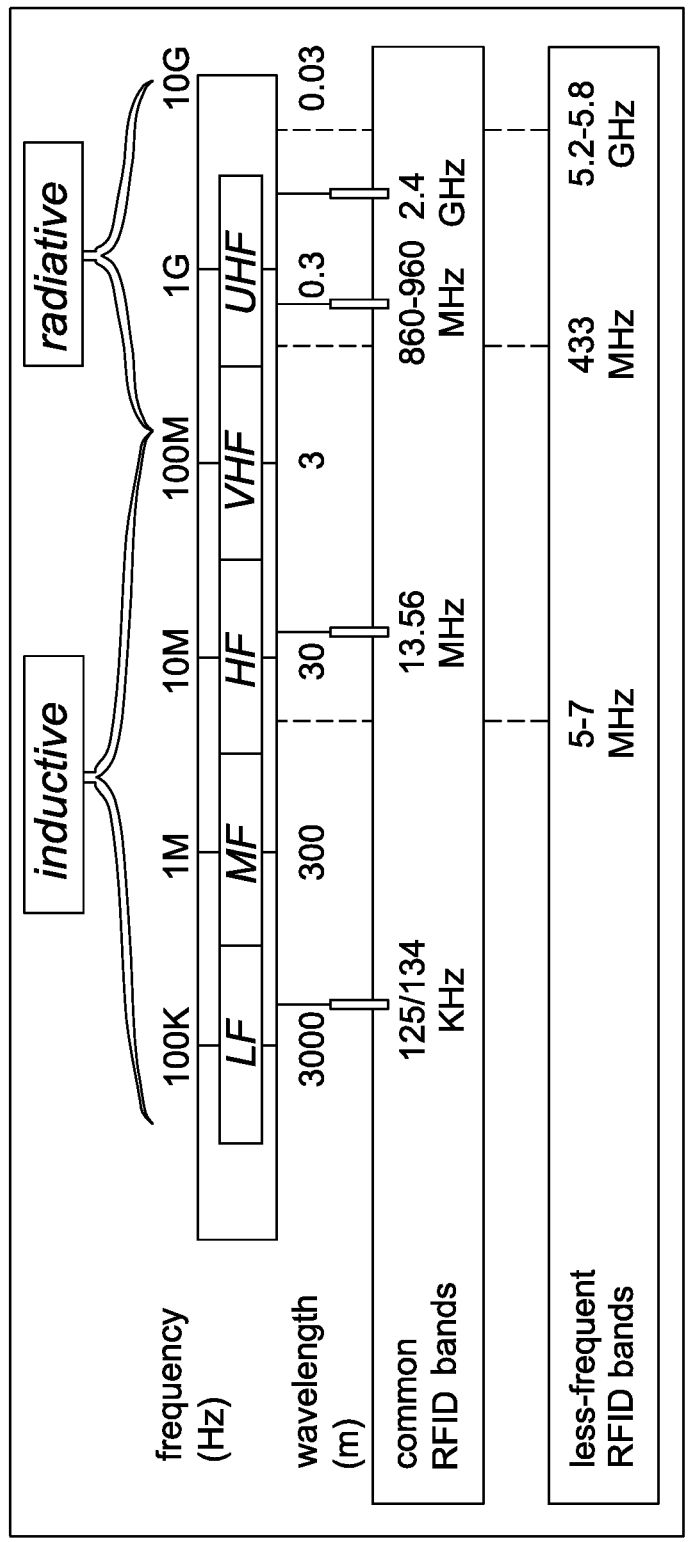
FIG. 1 is a diagram showing a low-frequency radio frequency identification system and a high-frequency radio frequency identification system.
Figure 2:
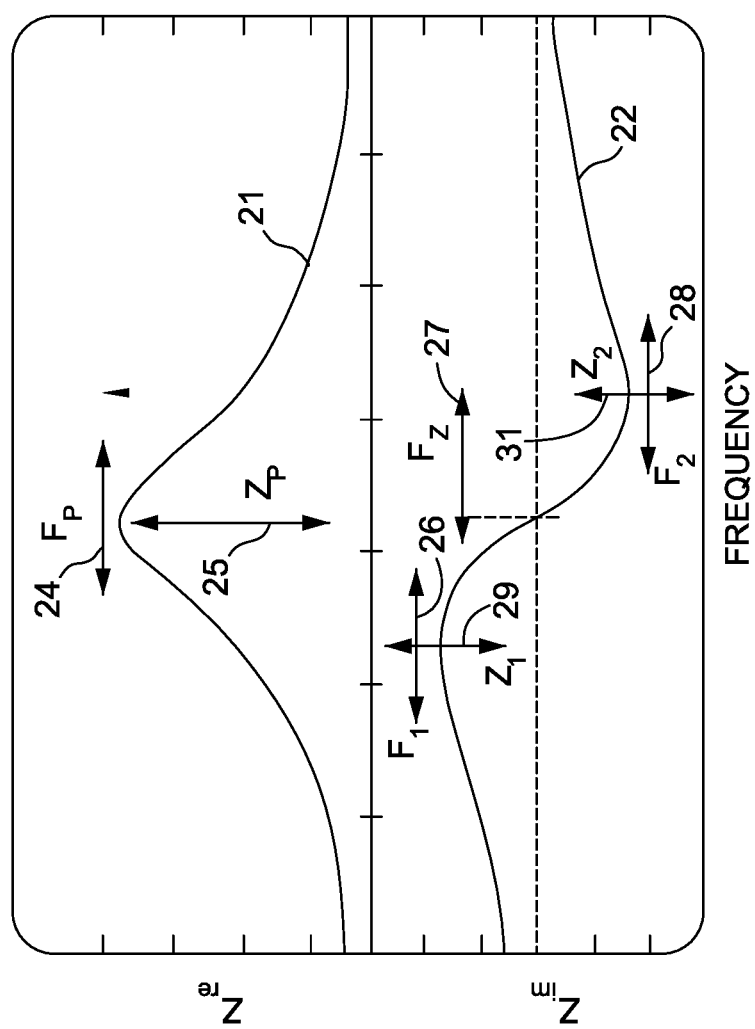
FIG. 2 is a diagram showing methods and systems for integrated interrogation of RFID sensors disclosed in U.S. Pat. No. 8,717,146 B2.
Figure 3:
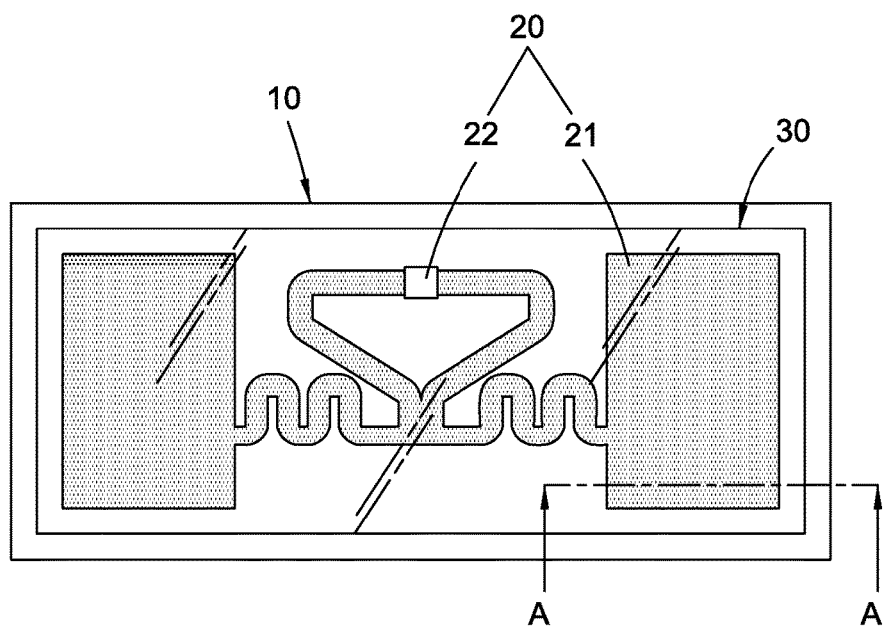
FIG. 3 is a top plan view showing the assembly of a printed RFID sensor tag according to a first embodiment of the present invention.
Figure 4:
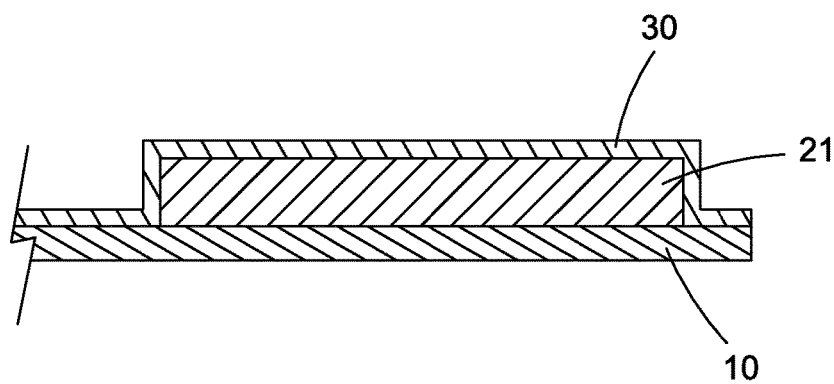
FIG. 4 is a cross sectional view taken along the line A-A of FIG. 3.

With reference to FIGS. 3 and 4, a printed RFID sensor tag according to a first embodiment of the present invention comprises: a substrate 10, a RFID sensor 20 arranged on a top of the substrate 10, and a protective layer 30 covering the RFID sensor 20.

The RFID sensor 20 includes a RFID sensing antenna 21 and a chip 22 adhered on the RFID sensing antenna 21, wherein the RFID sensing antenna 21 is partially or totally made of conductive sensing ink/glue printed on the top of the substrate 10, and the conductive sensing ink/glue is dried, solidified, and pressed after printing the conductive sensing ink/glue on the top of the substrate 10.

The conductive sensing ink/glue consists of conductive ink/glue and multiple sensing materials, wherein the multiple sensing materials are any one of chemically sensitive materials, photosensitive materials, thermal-sensitive materials, force-sensitive materials, and magnetic-sensitive materials. The conductive ink/glue is any one of conductive metal glue, conductive carbon glue, and conductive metal/carbon composite glue, wherein a conductor of the conductive sensing ink/glue is any one of metal, carbon, conductive polymers, and mixture of the metal, the carbon, and the conductive polymers.

The multiple sensing materials are oxides-based semiconductor materials or other-based semiconductor materials.

The oxides-based semiconductor materials are TiO2 or other materials, and the other-based semiconductor materials are GaAs or other materials.

The printed RFID sensor tag of the present invention is employed to sense multiple sensed targets of various physical or chemical properties. For example, when the multiple sensed targets, such as different gases, are attached on the RFID sensing antenna 21 made of conductive sensing ink/glue, hence constant dielectric of the conductive sensing ink/glue changes so as to alter resistance value/impedance. Accordingly, impedance of the printed RFID sensor tag of the present invention change obviously so as to obtain high sensitivity.

The protective layer 30 totally, partially covers or does not cover the RFID sensing antenna 21, in this embodiment, the protective layer 30 covers the RFID sensor 20 in a coating manner or in a film adhering manner. When the multiple sensing materials are photosensitive materials, the protective layer 30 has light transmittance so as to totally or partially cover the RFID sensing antenna 21, hence the protective layer 30 does not influence light sensing of the photosensitive materials. In another embodiment, when the multiple sensing materials contact with the multiple sensed targets respectively, for example, when the multiple sensing materials contact with water or gas, the protective layer 30 partially covers or does not cover the RFID sensing antenna 21.

When the RFID sensing antenna 21 is partially or totally made of RFID sensing ink/glue, the RFID sensing antenna 21 is applicable for sensing the multiple sensed targets of various physical or chemical properties so as to change operations or characteristics of the printed RFID sensor tag, wherein the operations of the printed RFID sensor tag contain reading or non-reading, and the characteristics of the printed RFID sensor tag contain: response band/response frequency (such as frequency range which responds reading of the RFID reader) and reading distance.

In the first embodiment, as shown in FIGS. 3 and 4, the RFID sensing antenna 21 is totally made of the conductive sensing ink/glue consisting of the multiple sensing materials, wherein the multiple sensing materials are any one of chemically sensitive materials, photosensitive materials, thermal-sensitive materials, force-sensitive materials, and magnetic-sensitive materials. When the multiple sensing materials are photosensitive materials, the RFID sensing antenna 21 changes its electrical property after being illuminated to absorb lights, hence resistance value/impedance of the RFID sensing antenna 21 alters, for example, the RFID sensor 20 is changed to a non-readable RFID sensor from a readable RFID sensor or the RFID sensor 20 is changed to a readable RFID sensor from a non-readable RFID sensor, hence the printed RFID sensor tag is changed to a RFID light sensing tag.

Figure 5:
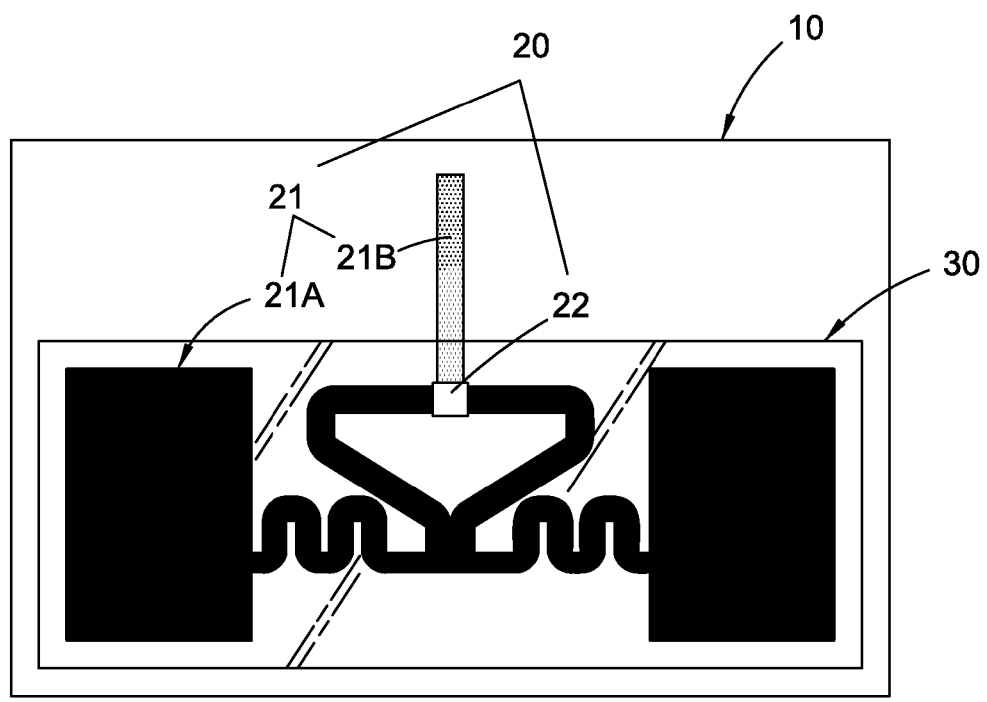
FIG. 5 is a top plan view showing the assembly of a printed RFID sensor tag according to a second embodiment of the present invention.

In a second embodiment, as shown in FIG. 5, the RFID sensing antenna 21 includes a main part 21A and a frequency modulation part 21B, wherein the main part 21A is electrically connected with the frequency modulation part 21B and is made of conductive ink/glue, and the frequency modulation part 21B is made of conductive sensing ink/glue consisting of multiple sensing materials, wherein the multiple sensing materials of the conductive sensing ink/glue are chemically sensitive materials, photosensitive materials, thermal-sensitive materials, force-sensitive materials, and magnetic-sensitive materials. Furthermore, the multiple sensing materials of the conductive sensing ink/glue are any one of oxides-based semiconductor materials or other-based semiconductor materials. Alternatively, the multiple sensing materials of the conductive sensing ink/glue are any one of metal, carbon, polymer, organic modifiers, and mixture of the metal, the carbon, the polymer, and the organic modifiers.

For instance, the multiple sensing materials of the conductive sensing ink/glue of the frequency modulation part 21B consists of superabsorbent polymers (SAP), hence after the SAP of the frequency modulation part 21B absorbs moisture, a volume of the frequency modulation part 21B expands so as to enhance resistance value/impedance, and a reading distance of a RFID reader which reads the printed RFID sensor tag increases, thus sensing humidity.

Figure 6:
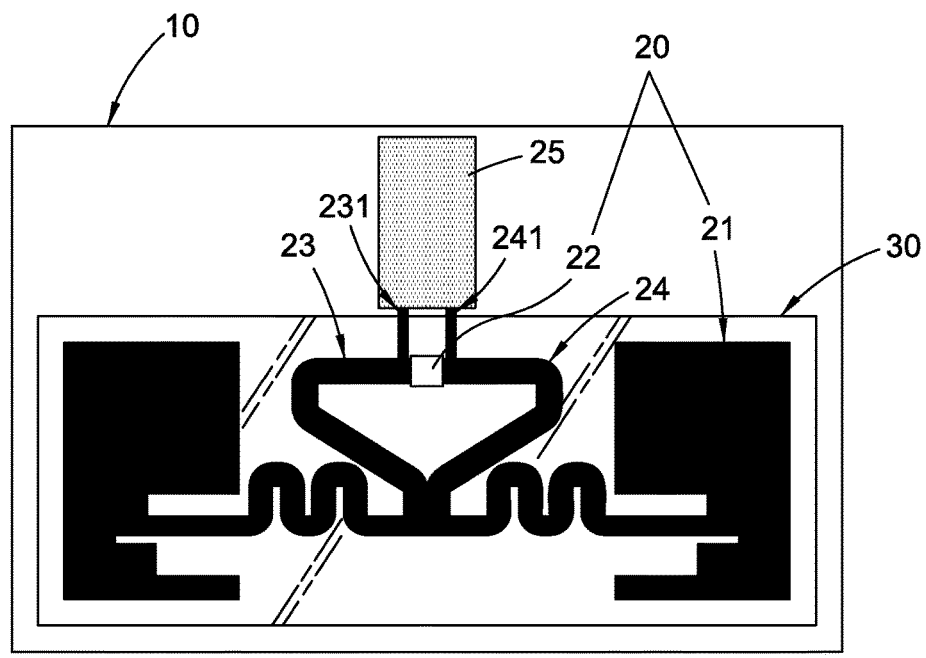
FIG. 6 is a top plan view showing the assembly of a printed RFID sensor tag according to a third embodiment of the present invention.

In a third embodiment, as illustrated in FIG. 6, the RFID sensing antenna 21 includes a first part 23, a second part 24, and a sensing part 25, wherein a first distal segment 231 of the first part 23 separates from a second distal segment 241 of the second part 24 so as to produce an open circuit between the first distal segment 231 of the first part 23 and the second distal segment 241 of the second part 24, wherein a chip 22 adheres on a connection portion of the first part 23 and the second part 24, the sensing part 25 is coupled with the first segment 231 of the first part 23 and the second segment 241 of the second part 24. The first part 23 and the second part 24 are made of conductive ink/glue, and the sensing part 25 are made of conductive sensing ink/glue consisting of multiple sensing materials, wherein the sensing part 25 is a normal open circuit and changes to a closed circuit after being influenced by multiple sensed targets.

The multiple sensing materials of the conductive sensing ink/glue of the sensing part 25 are any one of chemically sensitive materials, photosensitive materials, thermal-sensitive materials, force-sensitive materials, and magnetic-sensitive materials. The multiple sensing materials of the conductive sensing ink/glue of the sensing part 25 are oxides-based semiconductor materials or other-based semiconductor materials. Alternatively, the multiple sensing materials of the conductive sensing ink/glue are any one of metal, carbon, polymer, organic modifiers, and mixture of the metal, the carbon, the polymer, and the organic modifiers.

After illuminating the oxides-based semiconductor materials or the other-based semiconductor materials of the sensing part 25, the sensing part 25 changes to the closed circuit, and the open circuit between the first distal segment 231 of the first part 23 and the second distal segment 241 of the second part 24 changes to the closed circuit. Thereby, the RFID sensor 20 is changed to a non-readable RFID sensor from a readable RFID sensor or the RFID sensor 20 is changed to a readable RFID sensor from a non-readable RFID sensor, hence the printed RFID sensor tag is changed to a RFID light sensing tag, and the RFID light sensing tag is not read or its read distance is decreased after being illuminated.

In addition, the main part 21A of the second embodiment and the first part 23 and the second part 24 of the third embodiment are a printed antenna which does not include the multiple sensing materials or are a metal antenna. The frequency modulation part 21B of the second embodiment and the sensing part 25 of the third embodiment are made of the conductive sensing ink/glue consisting of the multiple sensing materials, wherein the multiple sensing materials are any one of chemically sensitive materials, photosensitive materials, thermal-sensitive materials, force-sensitive materials, and magnetic-sensitive materials. Thereby, the multiple sensing materials are influenced by the multiple sensed targets to change electrical property of the frequency modulation part 21B and the sensing part 25 and to alter the operations or the characteristics of the printed RFID sensor tag, hence the printed RFID sensor tag is applicable to sense chemical substances, lights, temperatures, force, and magnetism of the multiple sensed targets.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A printed RFID sensor tag comprising: a substrate, a RFID sensor arranged on a top of the substrate, and a protective layer covering the RFID sensor;
    the RFID sensor including a RFID sensing antenna and a chip adhered on the RFID sensing antenna, wherein the RFID sensing antenna is partially or totally made of conductive sensing ink/glue printed on the top of the substrate, and the conductive sensing ink/glue consists of conductive ink/glue and multiple sensing materials;
    wherein the RFID sensing antenna includes a first part, a second part, and a sensing part, wherein a first distal segment of the first part separates from a second distal segment of the second part so as to produce an open circuit between the first distal segment of the first part and the second distal segment of the second part, wherein a chip adheres on a connection portion of the first part and the second part, the sensing part is coupled with the first segment of the first part and the second segment of the second part; the first part and the second part are made of conductive ink/glue, and the sensing part are made of conductive sensing ink/glue, wherein the sensing part is a normal open circuit and changes to a closed circuit after being influenced by multiple sensed targets.

2. The printed RFID sensor tag as claimed in claim 1, wherein the multiple sensing materials are oxides-based semiconductor materials or other-based semiconductor materials.

3. The printed RFID sensor tag as claimed in claim 1, wherein the multiple sensing materials are any one of chemically sensitive materials, photosensitive materials, thermal-sensitive materials, force-sensitive materials, and magnetic-sensitive materials.

4. The printed RFID sensor tag as claimed in claim 1, wherein a conductor of the conductive sensing ink/glue is any one of metal, carbon, conductive polymers, and mixture of the metal, the carbon, and the conductive polymers.

5. The printed RFID sensor tag as claimed in claim 1, wherein the protective layer totally, partially covers or does not cover the RFID sensing antenna.

6. The printed RFID sensor tag as claimed in claim 1, wherein the RFID sensing antenna includes a main part and a frequency modulation part, the main part is electrically connected with the frequency modulation part and is made of conductive ink/glue, and the frequency modulation part is made of conductive sensing ink/glue.

7. The printed RFID sensor tag as claimed in claim 6, wherein multiple sensing materials of the conductive sensing ink/glue of the frequency modulation part are any one of oxides-based semiconductor materials or other-based semiconductor materials.

8. The printed RFID sensor tag as claimed in claim 6, wherein multiple sensing materials of the conductive sensing ink/glue of the frequency modulation part are any one of metal, carbon, polymer, organic modifiers, and mixture of the metal, the carbon, the polymer, and the organic modifiers.

9. The printed RFID sensor tag as claimed in claim 1, wherein multiple sensing materials of the conductive sensing ink/glue of the sensing part are oxides-based semiconductor materials or other-based semiconductor materials.

10. The printed RFID sensor tag as claimed in claim 1, wherein multiple sensing materials of the conductive sensing ink/glue of the sensing part are any one of metal, carbon, polymer, organic modifiers, and mixture of the metal, the carbon, the polymer, and the organic modifiers.

* * * * *